(12) United States Patent
Hong

(10) Patent No.: US 6,867,486 B2
(45) Date of Patent: Mar. 15, 2005

(54) STACK CHIP MODULE WITH ELECTRICAL CONNECTION AND ADHESION OF CHIPS THROUGH A BUMP FOR IMPROVED HEAT RELEASE CAPACITY

(75) Inventor: Joon Ki Hong, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 10/017,318

(22) Filed: Dec. 18, 2001

(65) Prior Publication Data

US 2003/0042589 A1 Mar. 6, 2003

(30) Foreign Application Priority Data

Aug. 30, 2001 (KR) ........................................ 2001-52870

(51) Int. Cl.[7] .............................................. H01L 23/02
(52) U.S. Cl. ........................ 257/686; 257/678; 257/777
(58) Field of Search ............................... 257/686, 691, 257/777, 697

(56) References Cited

U.S. PATENT DOCUMENTS

| | | | |
|---|---|---|---|
| 5,566,051 A | 10/1996 | Burns | |
| 5,744,827 A | 4/1998 | Jeong et al. | |
| 5,939,779 A | 8/1999 | Kim | |
| 5,998,860 A | * 12/1999 | Chan et al. | 257/679 |
| 6,137,162 A | 10/2000 | Park et al. | |
| 6,153,923 A | 11/2000 | Kazama | |
| 6,222,259 B1 | 4/2001 | Park et al. | |
| 6,258,623 B1 | 7/2001 | Moden et al. | |
| 6,265,771 B1 | * 7/2001 | Ference et al. | 257/706 |
| 6,303,981 B1 | * 10/2001 | Moden | 257/666 |
| 6,326,696 B1 | * 12/2001 | Horton et al. | 257/777 |
| 6,380,615 B1 | * 4/2002 | Park et al. | 257/666 |
| 6,414,385 B1 | * 7/2002 | Huang et al. | 257/690 |
| 2001/0026013 A1 | * 10/2001 | Mess et al. | 257/686 |
| 2002/0008309 A1 | * 1/2002 | Akiyama | 257/686 |
| 2002/0121687 A1 | * 9/2002 | Winderf | 257/686 |

FOREIGN PATENT DOCUMENTS

JP     06112461 A  *  4/1994  ........... H01L/27/14

* cited by examiner

*Primary Examiner*—Long Pham
*Assistant Examiner*—Nathan W. Ha
(74) *Attorney, Agent, or Firm*—Jacobson Holman PLLC

(57) ABSTRACT

A stack chip module includes a substrate having a predetermined-size groove on one side and a circuit pattern, one end of the circuit pattern being adjacent to the groove; a first semiconductor chip adhered in the groove of the substrate by adhesive and having a plurality of center pads and a plurality of edge pads, electrically connected to each other, on the upper part thereof; a plurality of gold wires for electrically connecting the circuit pattern of the substrate and the edge pads of the first semiconductor chip, respectively; a second semiconductor chip having a plurality of center pads corresponding to those of the first semiconductor chip, the formative side being opposite to that of the first semiconductor chip; and a plurality of bumps interposed between the center pads of the first semiconductor chip and the center pads of the second semiconductor chip for joining and electrically connecting them.

2 Claims, 5 Drawing Sheets

STACK CHIP MODULE WITH ELECTRICAL CONNECTION AND ADHESION OF CHIPS THROUGH A BUMP FOR IMPROVED HEAT RELEASE CAPACITY

BACKGROUND OF THE INVENTION

1. Field of the Invention

The present invention relates to semiconductor devices and, more particularly, to a stack chip module improving heat release properties and electric and mechanical reliability.

2. Description of the Related Art

As high-performance electric appliances are developed, efforts are focused on research to mount a large number of packages on a limited substrate. However, generally, one semiconductor chip is loaded in a package, making it difficult to obtain desired capacitance.

A method has been proposed in which a large number of cells are fabricated in a limited area in order to increase capacitance of a memory chip, that is, to accomplish high integration. However, the method requires difficult processes for fine line width and much development time. Therefore, a stacking method has been developed in order to accomplish high integration with ease.

The stacking method increases memory capacitance by stacking two or more semiconductor chips. According to the stacking method, two 64 M DRAM level chips are stacked to obtain a 128 M DRAM level and two 128 M DRAM level chips are stacked to obtain a 256 M DRAM level.

In order to stack two semiconductor chips, two packaged packages are stacked. Alternatively, two stacked bare chips are arranged in a package. FIGS. 1 and 2 show stack packages according to conventional methods.

FIG. 1 is a cross sectional view showing a conventional stack package according to a first method. As shown in FIG. 1, two semiconductor packages 10a, 10b are arranged in a stacked arrangement wherein an outer lead of the top package 10a is bonded to that of the bottom package 10b. In the packages 10a, 10b, lead frames 4a, 4b are adhered on one side of each semiconductor chip 1a, 1b by adhesives 3a, 3b, all respectively. Inner leads of each lead frame 4a, 4b are electrically connected to bonding pads 2a, 2b of each semiconductor chip 1a, 1b by gold wires 5a, 5b and the space including each semiconductor chip 1a, 1b and inner leads of lead frames 4a, 4b wire bonded thereto is molded by molding materials 6a, 6b so that only outer leads of lead frames 4a, 4b are exposed to both sides.

FIG. 2 is a cross sectional view showing a conventional stack package according to a second method. As shown in FIG. 2, two semiconductor chips 11a, 11b are arranged so that the formative sides of bonding pads 12a, 12b are opposite each other and lead frames 14a, 14b are adhered on bonding pad formative sides of each respective semiconductor chip 11a, 11b by adhesives 13a, 13b. Inner leads of each lead frame 14a, 14b are electrically connected to bonding pads 12a, 12b of each respective semiconductor 11a, 11b by gold wires 15a, 15b and the other side of lead the frame, that is not wire bonded to the bonding pad 12a of upper semiconductor chip 11a, is bonded to lead frame 14b of lower semiconductor chip 11b. The resulting structure is molded by molding material 16 so that only the outer lead of the lead frame of the lower semiconductor chip 11b is exposed to both sides.

However, the conventional stack packages have difficulty in installing heat sink, thereby lowering capacity of heat release. In addition, the conventional stack packages have several drawbacks as follows.

The stack package according to the first method has a structure in which two unit packages are stacked, thereby increasing the height. Furthermore, the electric signal paths of the upper package and that of the lower package are different relative to each other and therefore it is difficult to ensure electric reliability. Moreover, junction of upper and lower packages is accomplished by solder joint of each outer lead and therefore it is also difficult to ensure solder joint reliability.

In the stack package according to the second method, the distance between upper and lower gold wires for signal transmission is so close that signal noise may be generated when the two chips are operated. And, junction of lead frames is accomplished by laser welding, thereby increasing equipment investment. Moreover, it is impossible to rework the stack package.

SUMMARY OF THE INVENTION

Therefore, the present invention has been made to solve the above problems and an object of the invention is to provide a stack chip module with improved heat release capacity.

Another object of the present invention is to provide a stack chip module having good electrical properties and which is structurally stable.

In order to accomplish the above objects, the present invention comprises a substrate having predetermined-size grooves on one side and having a circuit pattern, with at least one end of the circuit pattern being adjacent to the groove; a first semiconductor chip adhered in the groove of the substrate by adhesive and having a plurality of center pads and a plurality of edge pads electrically connected to each other on the upper side; a plurality of gold wires for electrically connecting the circuit pattern of the substrate and the edge pad of the first semiconductor chip, respectively; a second semiconductor chip having a plurality of center pads corresponding to the center pads on the upper side of the first semiconductor chip and the pad formative side being arranged opposite to that of the first semiconductor chip; a plurality of bumps interposed between the center pad of the first semiconductor chip and that of the second semiconductor chip for joining and electrically connecting the center pads; and a molding material molding a side of the second semiconductor chip including the gold wire, the edge pad of the first semiconductor chip and the circuit pattern of the substrate.

The present invention may further comprise a first heat sink adhered on the back side of the second semiconductor chip, opposite the side with the center pads thereon.

Moreover, the present invention may further comprise a second heat sink arranged on the bottom of a groove of the substrate to be exposed to the other side of the substrate and being in contact with the bottom of the first semiconductor chip.

Additionally, according to the present invention, the grooves of the substrate are arranged in jig-jag form and the first and the second semiconductor chips are mounted on both sides of the substrate.

DETAILED DESCRIPTION OF THE INVENTION

Embodiment 1

Figure 6:
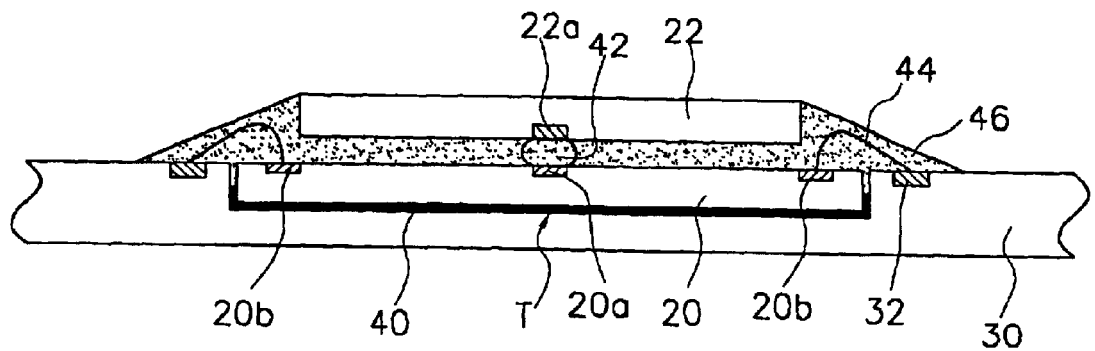

FIG. 6 is a cross sectional view showing a stack chip module according to a first embodiment of the present invention. As shown in FIG. 6, a lower semiconductor chip 20 (hereinafter referred to as the bottom chip) having a plurality of center pads 20a and a plurality of edge pads 20b is adhered in a groove T of a substrate 30 by adhesive 40 and the edge pad 20b is connected to the circuit pattern 32 by a gold wire 44. An upper semiconductor chip 22 (hereinafter referred to as the top chip) having a plurality of center pads 22a is arranged on the upper part of the bottom chip 20, the pad formative side being opposite to that of the bottom chip 20, wherein the center pad 22a of the top chip 22 and the center pad 20a of the bottom chip 20 are electrically connected by a bump 42. The wired bonded edge pad 20b of bottom chip 20 and a side of the top chip 22 including the circuit pattern 32 of substrate 30 are molded by a molding material 46.

In the bottom chip 20, edge pads 20b are electrically connected to each center pad 20a by electric logic, for example, metal tracer (not shown). The metal tracer is formed in patterning a metal layer or during wiring process after formation of protective layer. The top chip 22 has a size that does not cover the wired bonded edge pad 20b of the bottom chip 20, that is, is arranged into the bottom chip 20 to the inside of edge pad 20b.

The center pads 20a, 22a of bottom chip 20 and top chip 22, respectively, are arranged in equal numbers to correspond to each other and they are electrically connected by a bump 42. The top chip 22 and the bottom chip 20 are joined by the bump 42. The bump 42 may be made of nickel, gold or solder, or a mixture thereof, and the height thereof is over 40 $\mu$m, desirably 40 to 100 $\mu$m, in consideration of junction reliability.

The substrate 30 is a printed circuit board having a shape that can be put into a socket of a main board. The substrate has grooves T having a size to accommodate the bottom chip 20 on one side, wherein one side of the circuit pattern 32, that is, electrode terminal is arranged to be adjacent to the groove T. Here, the substrate has a thickness of 1,200 to 1,600 $\mu$m and the groove has a depth similar to the thickness of bottom chip 20, desirably, 20 to 30 $\mu$m.

The molding material 46 is formed to protect a gold wire 44, an edge pad 20b of the bottom chip 20 and the circuit pattern 32 of substrate 30. The molding material 46 is formed by dispensing a mold resin and the mold resin is underfilled between the chips 20, 22. The molding material 46 is made of epoxy or transformed epoxy resin, polyester or transformed polymer, acrylic ester, transformed ester, silicon resin, phenoxy resin, polyurethane, polysulfied, cyanocrylats, polyelexins and other polymers curing in thermal, room temperature.

FIGS. 3 to 6 illustrate the fabrication method of a stack chip module according to a first embodiment of the present invention.

Figure 1:
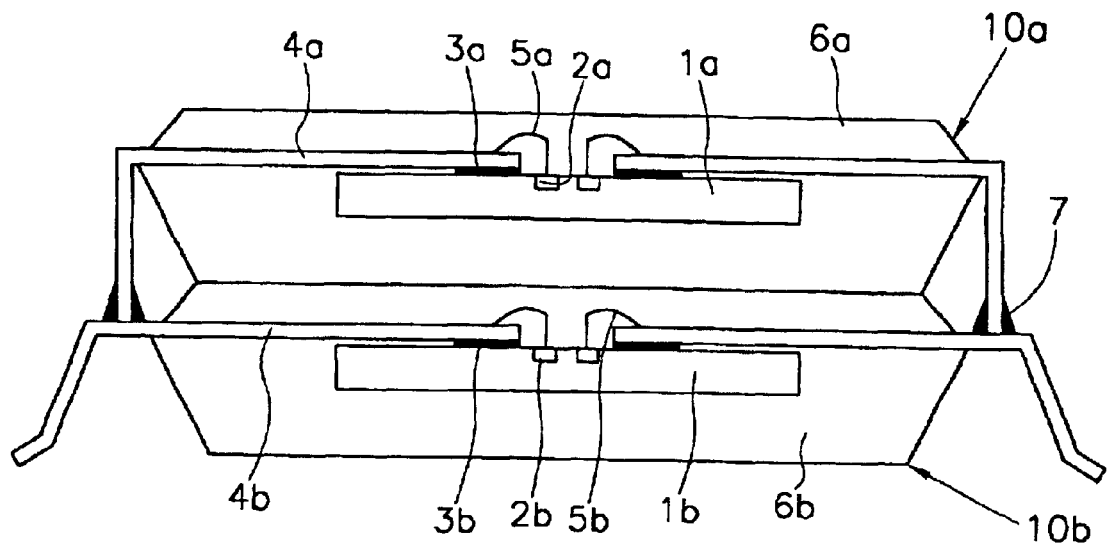
FIGS. 1 and 2 are cross sectional views showing a conventional stack package.
Figure 2:
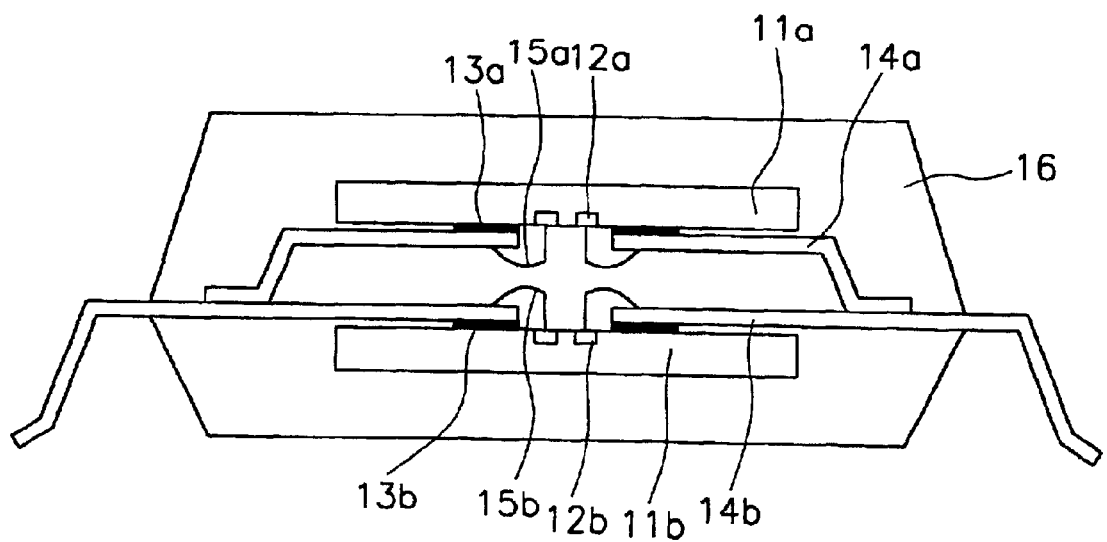
Figure 3:
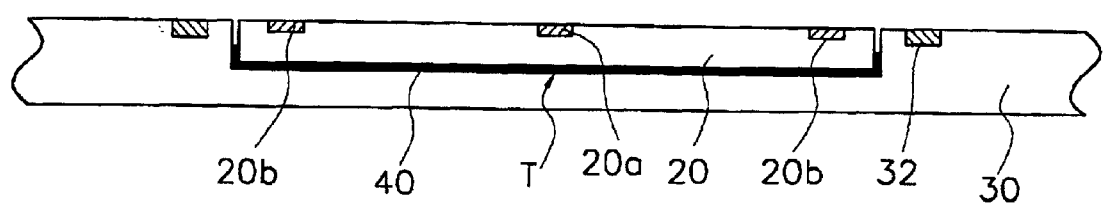
FIGS. 3 to 6 are cross sectional views showing a fabrication method for a stack chip module according to a first embodiment of the present invention.

Referring to FIG. 3, a substrate 30 having a circuit pattern 32 and a groove T of predetermined depth on one side is provided and then adhesive 40 is applied to the bottom of the groove T. Subsequently, a bottom chip 20 having a plurality of center pads 20a and a plurality of edge pads 20b is installed in the groove T and then mechanically fastened stably by curing of the adhesive 40.

Figure 4:
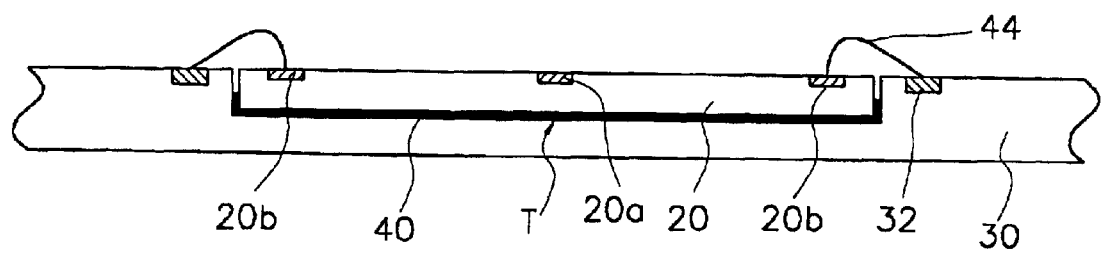

Referring to FIG. 4, the edge pad 20b of bottom chip 20 and the circuit pattern 32 of substrate 30 are electrically connected by a gold wire 44 according to a wire bonding process.

Figure 5:
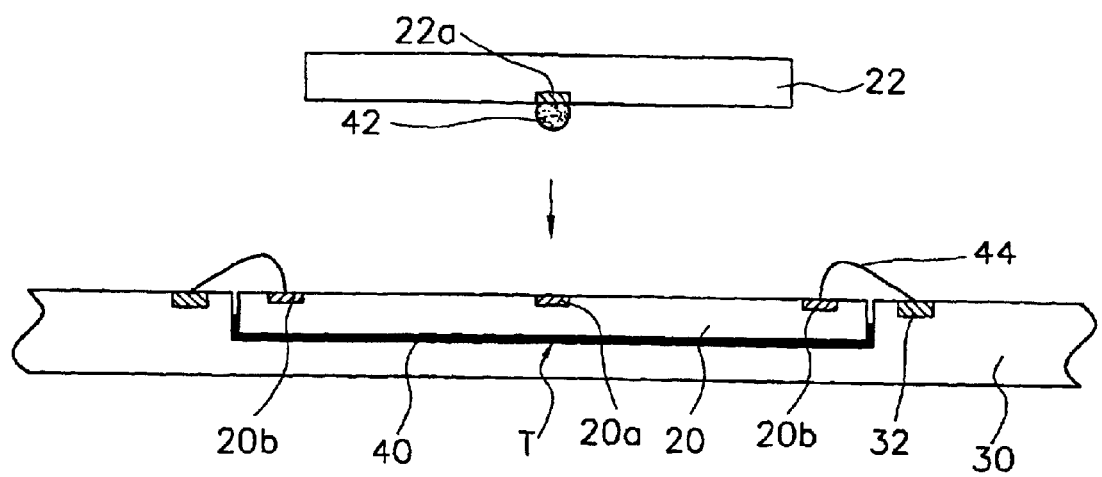

Referring to FIG. 5, a top chip 22 having a plurality of center pads 22a is provided and then a bump 42 is formed on each center pad 22a. The bump 42 may be made of nickel, gold and solder and has a height of over 40 $\mu$m, desirably, 40 to 100 $\mu$m, in consideration of junction reliability. The top chip 22 is bonded so that the bump 42 on the center pad 22a is abutted on the center pad 20a of the bottom chip 20 and therefore, the center pad 22a of the top chip 22 and the center pad 20a of the bottom chip 20 are electrically connected. After the bonding process, a thermal treatment process such as reflow may be performed in order to increase junction strength between the bottom chip and the top chip through the bump.

Referring to FIG. 6, a molding material 46 is formed to cover the wire bonded edge pad 20b of bottom chip 20, a circuit pattern 32 of substrate 30 and a side of the top chip 22 in accordance with a dispensing process, thereby completing a stack chip module according to the present invention. Here, the space between chips 20, 22 is underfilled by the molding material 46 during the dispensing process and it is desirable that the space between chips 20, 22 is maintained under vacuum to minimize void generation therein.

The above-mentioned stack chip module of the present invention has several advantages as follows.

First, the stack chip module has a structure in which two bare chips are stacked and, therefore, the height is lower than that of the first conventional stack package. As a result, the structure is more stable than the first conventional stack package.

Second, the electric junction of the chips is accomplished by the bump and, therefore, the electric signal path of the top chip is not longer than that of the first conventional stack package, thereby preventing reduction in solder joint reliability.

Third, the electric junction of the chips is accomplished by the bump, thereby reducing signal noise generation in operation of the chips, as compared with the first conventional stack package. In particular, according to the present invention, it is possible to minimize signal noise by a metal tracer of the bottom chip.

Fourth, junction of the chips is accomplished by the bump and the electrical connection of the substrate and the bottom chip is accomplished by a gold wire; as a result, there is no additional equipment cost and it is possible to rework the stack package since it is easy to remove the bump and gold wire.

Fifth, the stack chip module has a structure such that a back side of the top chip is exposed to the outside and therefore, it is easy to install a heat sink and improve heat release capacity.

Sixth, the stack chip module has a structure such that two chips are arranged around a bump, thereby removing warpage and improving mechanical reliability.

Embodiment 2

Figure 7:
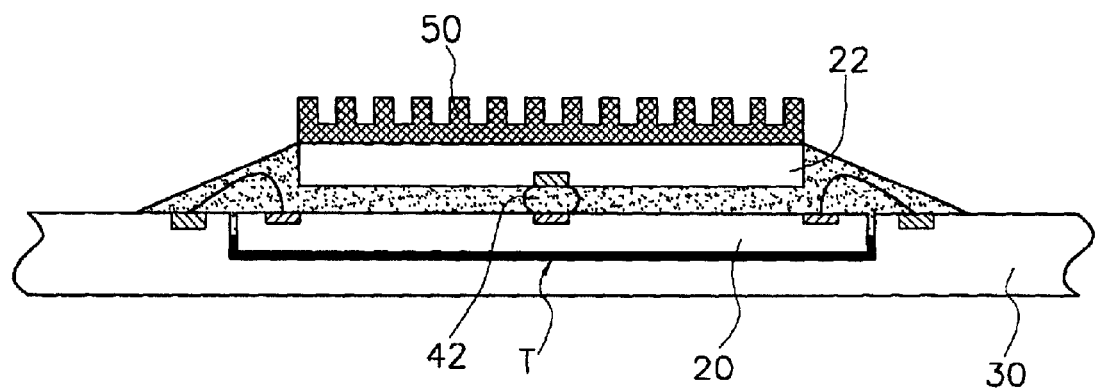
FIG. 7 is a cross sectional view showing a stack chip module according to a second embodiment of the present invention.

FIG. 7 is a cross sectional view showing a stack chip module according to a second embodiment of the present invention. Referring to FIG. 7, the first heat sink 50 is adhered on a back side of exposed top chip 22. Therefore, the stack chip module according to the second embodiment of the present invention has improved heat release capacity.

Embodiment 3

Figure 8:
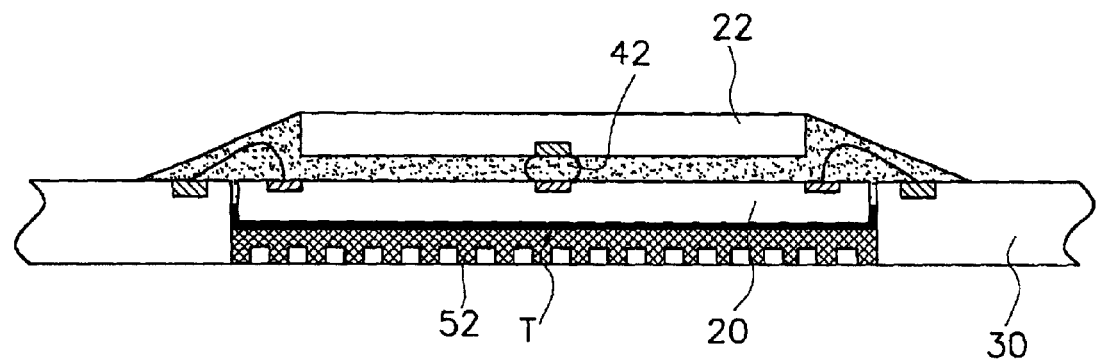
FIG. 8 is a cross sectional view showing a stack chip module according to a third embodiment of the present invention.

FIG. 8 is a cross sectional view showing a stack chip module according to a third embodiment of the present invention. Referring to FIG. 8, a second heat sink 52 is prepared on a substrate whereon a bottom chip 20 is installed, that is, on a bottom of groove T, to be exposed to the other side of the substrate 30. The second heat sink 52 is desirably formed by a plating process in manufacturing the substrate 30 and the upper side thereof corresponds to the bottom of groove T, thereby being in contact with the bottom chip 20.

Although it is not shown in the drawings, a second heat sink 50 may be additionally adhered on the back side of the exposed top chip 22 in order to improve heat release capacity.

Embodiment 4

Figure 9:
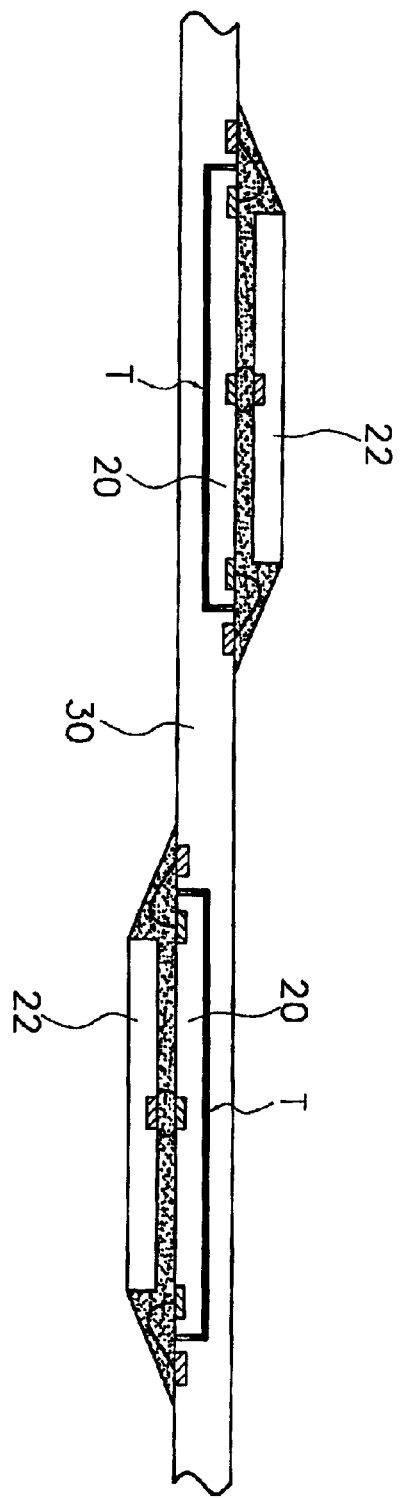
FIG. 9 is a cross sectional view showing a stack chip module according to a fourth embodiment of the present invention.

FIG. 9 is a cross sectional view showing a stack chip module according to a fourth embodiment of the present invention. Referring to FIG. 9, grooves T for installing a bottom chip 20 are formed in a jig-jag form, alternating on one side and then on the other side of substrate 30 and therefore, chips 20, 22 are mounted on opposite sides of the substrate 30. Accordingly, it is possible to mount a large number of chips on both sides of the substrate 30, thereby improving the capacity of the module.

As described above, according to the present invention, adhesion of chips and electrical connection are accomplished by a bump. As a result, it is possible to manufacture light and small stack chip modules and to improve the electrical and mechanical reliability thereof. Moreover, the present invention is economically effective since the stack chip module is manufactured by using conventional equipments.

Although the preferred embodiment of this invention has been disclosed for illustrative purpose, those skilled in the art will appreciate that various modifications, additions and substitutions are possible, without departing from the scope and spirit of the invention.

What is claimed is:

1. A stack chip module including:

a substrate having first and second opposing sides, each of said sides having a predetermined-size groove with an adjacent circuit pattern, said grooves being arranged on said opposing sides of said substrate such that said grooves do not overlap with each other;

a first semiconductor chip adhered in each groove of the substrate by adhesive, said first semiconductor chip having a plurality of center pads and a plurality of edge pads, electrically connected to each other, on an upper part thereof;

a plurality of gold wires for electrically connecting a respective circuit pattern of the substrate and the edge pads of a respective first semiconductor chip, respectively;

for said first semiconductor chip, a second semiconductor chip having a plurality of center pads corresponding to said plurality of center pads on said upper part of the respective first semiconductor chip and a formative side being opposite to that of the respective first semiconductor chip;

a plurality of bumps interposed between the center pads of the first semiconductor chip and the center pads of the corresponding second semiconductor chip for joining and electrically connecting said respective center pads; and a molding material molding a side of the second semiconductor chip including the gold wires, the edge pads of a respective circuit first semiconductor chip and the circuit pattern of the substrate.

2. The stack chip module according to claim 1, wherein the bumps have a height of 40 to 100 $\mu$m.

* * * * *